United States Patent
Keung et al.

(10) Patent No.: US 9,992,437 B1
(45) Date of Patent: *Jun. 5, 2018

(54) STACKED IMAGE SENSOR PIXEL CELL WITH IN-PIXEL VERTICAL CHANNEL TRANSFER TRANSISTOR

(71) Applicant: JiangSu SmartSens Technology Co. Ltd, Sshanghai (CN)

(72) Inventors: Ko Ping Keung, Ma On Shan (HK); Zhibin Xiong, Granite Bay, CA (US); Chen Xu, Shanghai (CN); Zexu Shao, Shanghai (CN)

(73) Assignee: SmartSense Technology(U.S.), Inc., Shanghai (CN)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/424,124

(22) Filed: Feb. 3, 2017

(51) Int. Cl.
*H04N 5/378* (2011.01)
*H04N 5/374* (2011.01)
*H01L 27/146* (2006.01)

(52) U.S. Cl.
CPC ....... *H04N 5/378* (2013.01); *H01L 27/14616* (2013.01); *H01L 27/14643* (2013.01); *H01L 27/14689* (2013.01); *H04N 5/374* (2013.01)

(58) Field of Classification Search
CPC .. H04N 5/378; H04N 5/374; H01L 27/14616; H01L 27/14629; H01L 27/14643; H01L 27/1464
See application file for complete search history.

(56) References Cited

U.S. PATENT DOCUMENTS

| | | | |
|---|---|---|---|
| 5,641,694 A * | 6/1997 | Kenney | H01L 27/10841 257/E21.131 |
| 7,781,716 B2 | 8/2010 | Anderson | |
| 8,933,544 B2 | 1/2015 | Mao et al. | |
| 9,344,658 B2 | 5/2016 | Dai et al. | |
| 9,478,579 B2 | 10/2016 | Dai et al. | |
| 9,520,427 B1 * | 12/2016 | Yoo | H01L 27/14614 |
| 9,620,540 B1 * | 4/2017 | Yang | H01L 27/14616 |
| 2006/0084195 A1 * | 4/2006 | Lyu | H01L 27/14603 438/48 |
| 2013/0092820 A1 * | 4/2013 | Takemoto | H04N 5/369 250/208.1 |
| 2014/0211056 A1 * | 7/2014 | Fan | H01L 27/14643 348/308 |
| 2015/0035028 A1 * | 2/2015 | Fan | H01L 27/14623 257/292 |
| 2015/0108555 A1 * | 4/2015 | Jung | H01L 29/66666 257/290 |
| 2017/0179174 A1 * | 6/2017 | Yang | H01L 27/14616 |
| 2017/0278883 A1 * | 9/2017 | Kwag | H01L 27/14614 |
| 2017/0287959 A1 * | 10/2017 | Kwag | H01L 27/14616 |
| 2017/0294468 A1 * | 10/2017 | Park | H01L 27/14616 |

* cited by examiner

*Primary Examiner* — Abdelaaziz Tissire
(74) *Attorney, Agent, or Firm* — Eric Karich; Karich & Associates (57) ABSTRACT

A pixel cell has a photodiode, a readout circuit, and a vertical transfer transistor. The photodiode is disposed within a first substrate of a first semiconductor chip for accumulating an image charge in response to light incident upon the photodiode. The readout circuit is disposed within a second substrate of a second semiconductor chip. The vertical transfer transistor is coupled between the photodiode and the readout circuitry to transfer the image charge from the photodiode to the readout circuitry.

5 Claims, 9 Drawing Sheets

STACKED IMAGE SENSOR PIXEL CELL WITH IN-PIXEL VERTICAL CHANNEL TRANSFER TRANSISTOR

BACKGROUND OF THE INVENTION

Field of the Invention

This invention relates generally to image sensors and more particularly to CMOS image sensors in a stacked chip formation. A bottom chip includes an array of light sensitive regions and structures to capture an image. A top chip includes circuit elements to extract an image from the array. The image sensor may be incorporated within a digital camera.

Description of Related Art

The prior art teaches a wide variety of image capture devices. A typical image capture device used in the prior art includes an image sensor and an imaging lens. The imaging lens focuses light onto the image sensor to form an image, and the image sensor converts the light into electrical signals. The electric signals are output from the image capture device to other components of a host electronic system. The image capture device and the other components of a host electronic system form an imaging system. Image sensors have become ubiquitous and may be found in a variety of electronic systems, for example a mobile device, a digital camera, a medical device, or a computer.

A typical image sensor comprises a number of light sensitive picture elements ("pixels") arranged in a two-dimensional array. Such an image sensor may be configured to produce a color image by forming a color filter array (CFA) over the pixels. The technology used to manufacture image sensors, and in particular, complementary metal-oxide-semiconductor ("CMOS") image sensors, has continued to advance at great pace. For example, the demands of higher resolution and lower power consumption have encouraged the further miniaturization and integration of these image sensors. However, miniaturization has come with the loss of pixel photosensitivity and dynamic range which require new approaches in order to mitigate.

It is known to form a given image sensor as a so-called stacked image sensor. In a typical arrangement of this type, photodiodes or other light sensitive elements of the pixel array are formed in a first semiconductor die or layer, while associated circuitry for processing signals from the photosensitive elements is formed in a second semiconductor die or layer that overlies the first semiconductor die or layer. These first and second semiconductor die or layers are more generally referred to herein as sensor and circuit chips, respectively. More precisely, the first and second semiconductor die are formed alongside many other like die on the first and second semiconductor wafers which are stacked, after aligning associated inter-wafer interconnects, and diced or cut into a stacked assembly of commonly called semiconductor chips. When reference is made to stacking two chips it is understood that in common practice two wafers were stacked and diced into chips that remain stacked to form an electrical system such as a stacked image sensor. Also the inter-wafer interconnects coupling the sensor and circuit wafers may be referred to as inter-chip interconnects while intra-wafer interconnects and intra-chip interconnects refer to interconnections formed among devices residing on the wafer and chip respectively. An advantage associated with this arrangement includes that the resulting image sensor system occupies a reduced area compared with not stacked arrangements. An additional advantage is that different manufacturing methods and materials may be used to fabricate each chip allowing independent optimizations to be employed.

An opportunity for improvement of stacked image sensors in which the sensor and circuit chips are interconnected at each pixel element arises when certain novel circuit elements are employed at the interconnections. The present invention fulfills these needs and provides further advantages as described in the following summary.

SUMMARY OF THE INVENTION

The present invention teaches certain benefits in construction and use which give rise to the objectives described below.

The present invention provides a pixel cell that has a photodiode, a readout circuit, and a vertical channel transfer transistor. The photodiode is disposed within a first substrate of a first semiconductor chip for accumulating an image charge in response to light incident upon the photodiode. The readout circuit is disposed within a second substrate of a second semiconductor chip. The vertical channel transfer transistor is coupled between the photodiode and the readout circuitry to transfer the image charge from the photodiode to the readout circuitry.

A primary objective of the present invention is to provide an image sensor pixel having advantages not taught by the prior art.

Another objective is to provide a pixel cell that occupies less area and may thereby reduce pixel array size and manufacturing cost.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the present invention. In such drawings.

DETAILED DESCRIPTION OF THE INVENTION

The above-described drawing figures illustrate the invention, a stacked image sensor pixel cell with in-pixel vertical channel transfer transistor for the improvement of stacked image sensors. Embodiments of a stacked image sensor with in-pixel vertical channel transfer transistor are disclosed herein. In the following description, numerous specific details are set forth in order to provide a thorough understanding of the present invention. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Figure 1:
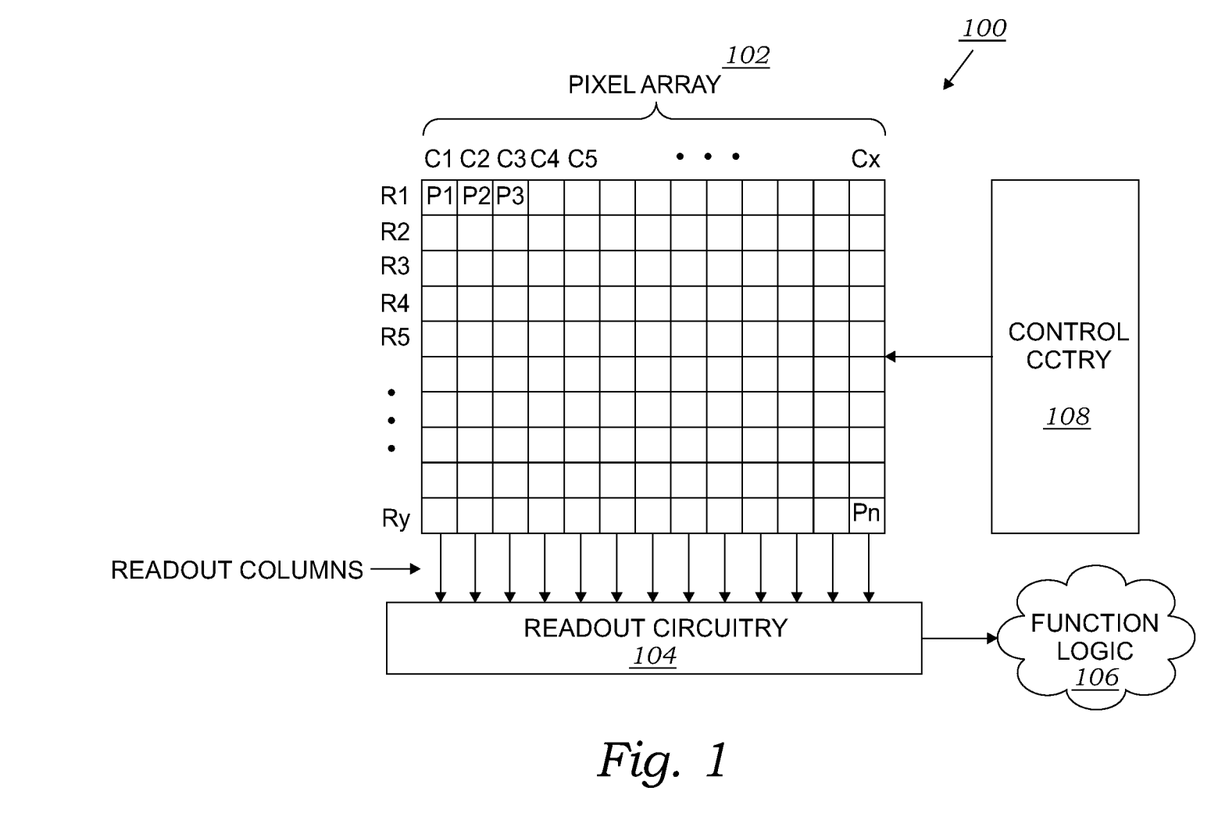
FIG. 1 is a diagram illustrating one example of an imaging system including a pixel array having stacked image sensor pixel cells included in an integrated circuit system having an in-pixel vertical channel transfer transistor according to one embodiment of the present invention.

FIG. 1 is a diagram illustrating one example of an imaging system 100 including an example pixel array 102 having a plurality of image sensor pixels included in an example integrated circuit system featuring an in-pixel vertical channel transfer transistor in accordance with the teachings of the present invention. As shown in the depicted example, imaging system 100 includes pixel array 102 coupled to control circuitry 108 and readout circuitry 104, which is coupled to function logic 106. In one example, pixel array 102 is a two-dimensional (2D) array of image sensor pixels (e.g., pixels P1, P2 . . . , Pn). As illustrated, each pixel is arranged into a row (e.g., rows R1 to Ry) and a column (e.g., column C1 to Cx) to acquire image data of a person, place, object, etc., which can then be used to render a 2D image of the person, place, object, etc. In one example, after each pixel has acquired its image data or image charge, the image data is readout by readout circuitry 104 and then transferred to function logic 106. In various examples, readout circuitry 104 may include amplification circuitry, analog-to-digital (ADC) conversion circuitry, or otherwise. Function logic 106 may simply store the image data or even manipulate the image data by applying post image effects (e.g., crop, rotate, remove red eye, adjust brightness, adjust contrast, or otherwise). In one example, readout circuitry 104 may readout a row of image data at a time along readout column lines (illustrated) or may readout the image data using a variety of other techniques (not illustrated), such as a serial readout or a full parallel readout of all pixels simultaneously. In one example, control circuitry 108 is coupled to pixel array 102 to control operational characteristics of pixel array 102. For example, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows.

Figure 2:
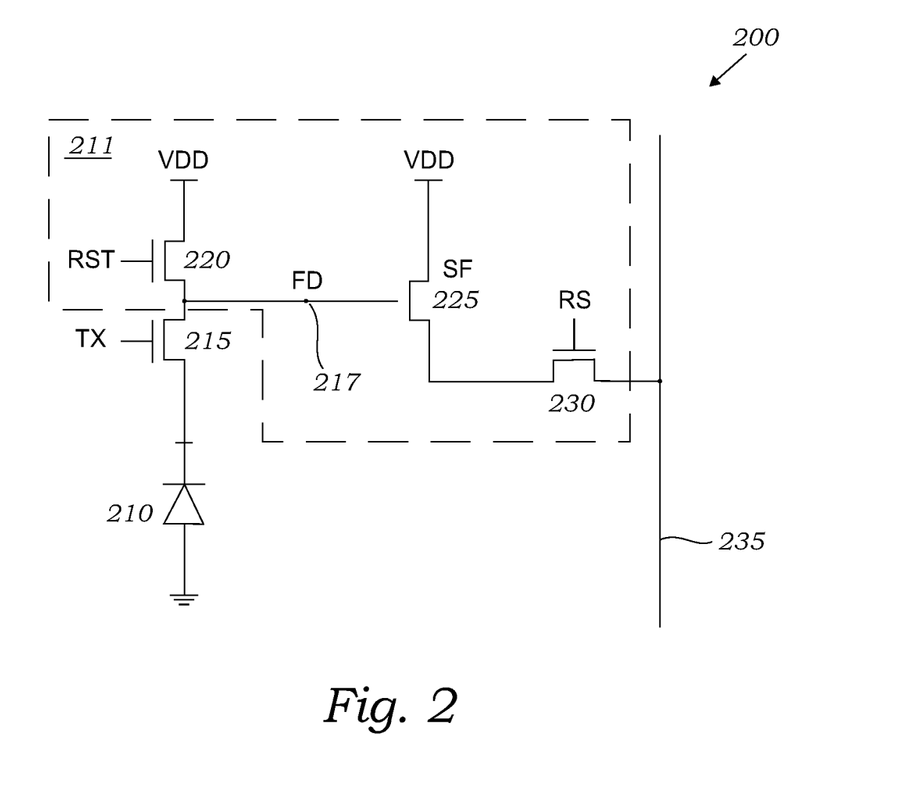
FIG. 2 is an electrical schematic that illustrates one example of a stacked image sensor pixel cell with in-pixel vertical channel transfer transistor according to one embodiment of the present invention.

FIG. 2 is an electrical schematic that illustrates one example of a stacked image sensor pixel cell with in-pixel vertical channel transfer transistor in accordance with the teachings of the present invention. Each sensor pixel 200 includes a photodiode 210 (e.g., photosensitive element) and pixel support circuitry 211 as shown. Photodiode 210 may be a "pinned" photodiode as is commonly present in CMOS image sensors. Photodiode 210 may be disposed on a sensor chip of a stacked die system, while pixel support circuitry 211 may be disposed on a separate circuit chip. In one example, pixel support circuitry 211 includes a reset transistor 220, source follower (SF) transistor 225, and row select transistor 230 on a circuit chip coupled to a vertical channel transfer transistor 215 and photodiode 210 on a sensor chip of a stacked die system as shown. In another example, not shown, pixel support circuitry includes a reset transistor 220, source follower (SF) transistor 225, row select transistor 230 and vertical channel transfer transistor 215 on a circuit chip coupled to a photodiode 210 on a sensor chip of a stacked die system. During operation, photosensitive element 210 photo-generates charge in response to incident light during an exposure period. Vertical channel transfer transistor 215 is coupled to receive a transfer signal TX, which causes vertical channel transfer transistor 215 to transfer the charge accumulated in photodiode 210 to floating diffusion (FD) node 217. Floating diffusion 217 is in effect the drain of the transfer transistor while the photodiode is the source of vertical transfer transistor 215. In one embodiment vertical channel transfer transistor is a vertical channel metal-oxide semiconductor field-effect transistor (MOSFET). Reset transistor 220 is coupled between power rail VDD and floating diffusion node 217 to reset sensor pixel 200 (e.g., discharge or charge floating diffusion node 217 and photodiode 210 to a preset voltage) in response to a reset signal RST. Floating diffusion node 217 is coupled to control the gate terminal of source-follower transistor 225. Source-follower transistor 225 is coupled between power rail VDD and row select transistor 230 to amplify a signal responsive to the charge on the floating diffusion FD node 217. Row select transistor 230 couples the output of pixel circuitry from the source-follower transistor 225 to the readout column, or bit line 235, in response to a row select signal RS. Photodiode 210 and floating diffusion node 217 are reset by temporarily asserting the reset signal RST and transfer signal TX. The accumulating window (e.g., exposure period) begins when the transfer signal TX is de-asserted, which permits incident light to photo-generate charge in photodiode 210. As photo-generated electrons accumulate in photodiode 210, its voltage decreases (electrons are negative charge carriers). The voltage or charge on photodiode 210 is representative of the intensity of the light incident on photodiode 210 during the exposure period. At the end of the exposure period, the reset signal RST is de-asserted, which turns off the reset transistor 220 and isolates floating diffusion FD node 217 from VDD. The transfer signal TX is then asserted to couple photodiode 210 to floating diffusion node 217. The charge is transferred from photodiode 210 to the floating diffusion FD node 217 through the vertical channel transfer transistor 215, which causes the voltage of floating diffusion FD node 217 to drop by an amount proportional to photo-generated electrons accumulated on photodiode 210 during the exposure period.

Figure 3A:
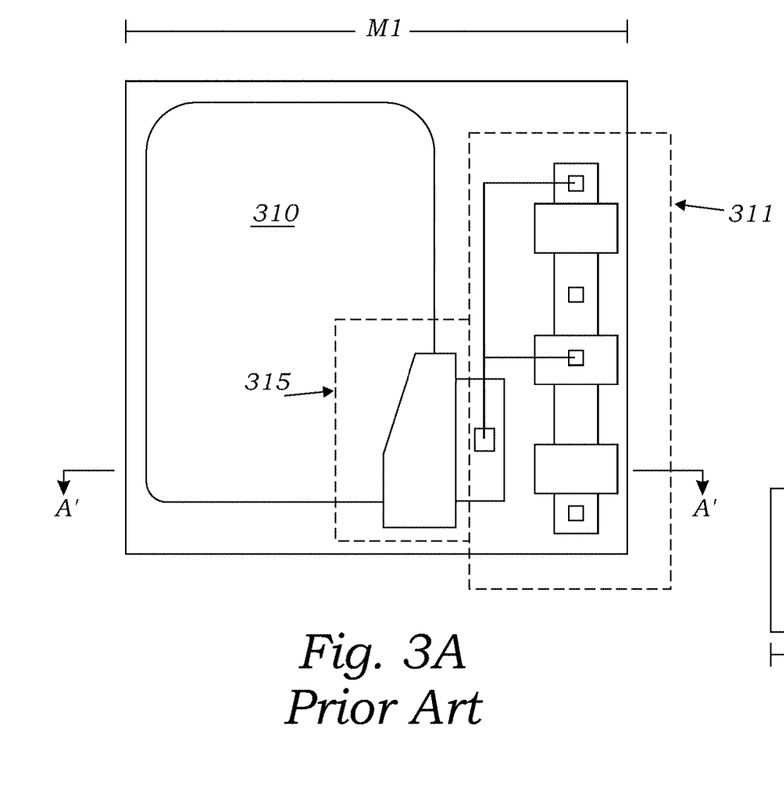
FIG. 3A is a diagram illustrating a common pixel cell layout in the prior art wherein photodiode 310, transfer transistor 315, and pixel circuitry 311 occupy the same semiconductor wafer or chip.
Figure 3B:
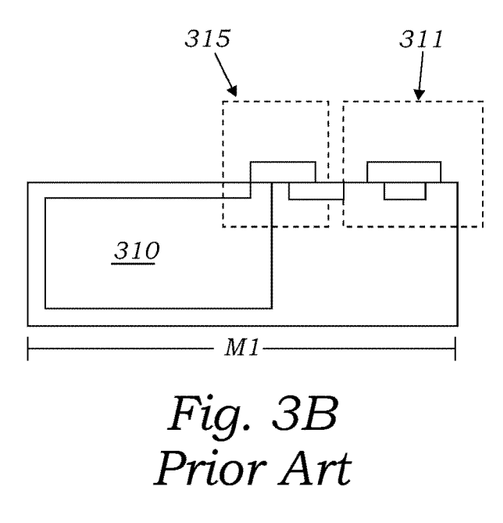
FIG. 3B is a cross section diagram of the pixel cell shown in FIG. 3A.

FIG. 3A is a diagram illustrating a common pixel cell layout in the prior art wherein photodiode 310, transfer transistor 315, and pixel circuitry 311 occupy the same semiconductor wafer or chip. FIG. 3B is a cross section diagram of the pixel cell shown in FIG. 3A along its cross section line AA'. Photodiode 310 and pixel circuitry 311 correspond in kind to the photodiode and pixel circuitry denoted as photodiode 210 and pixel circuitry 211 in FIG. 2 except that they occupy the same wafer of chip. Transfer transistor 315 occupies the same location electrically as does transfer transistor 215 in FIG. 2 except that transfer transistor 315 is a commonly understood planar complementary metal-oxide semiconductor field-effect transistor (CMOSFET) wherein its source, channel, and drain components are located within the semiconductor substrate and parallel to the surface of the semiconductor substrate. It is advantageous for die dimension M1, as illustrated in FIGS. 3A and 3B to be as small as possible in order to reduce pixel array size and manufacturing cost. However die dimension M1 is limited by required minimum design rules of a manufacturing technology generation which set the closest approach of for example pixel circuitry 311 to transfer transistor 315.

This situation is among the factors that drove the separation of pixel cells into two stacked chips where the pixel circuitry can be stacked over the photodiode and transfer transistor to result in a reduction of die dimension M1.

Figures 4A, 4B:
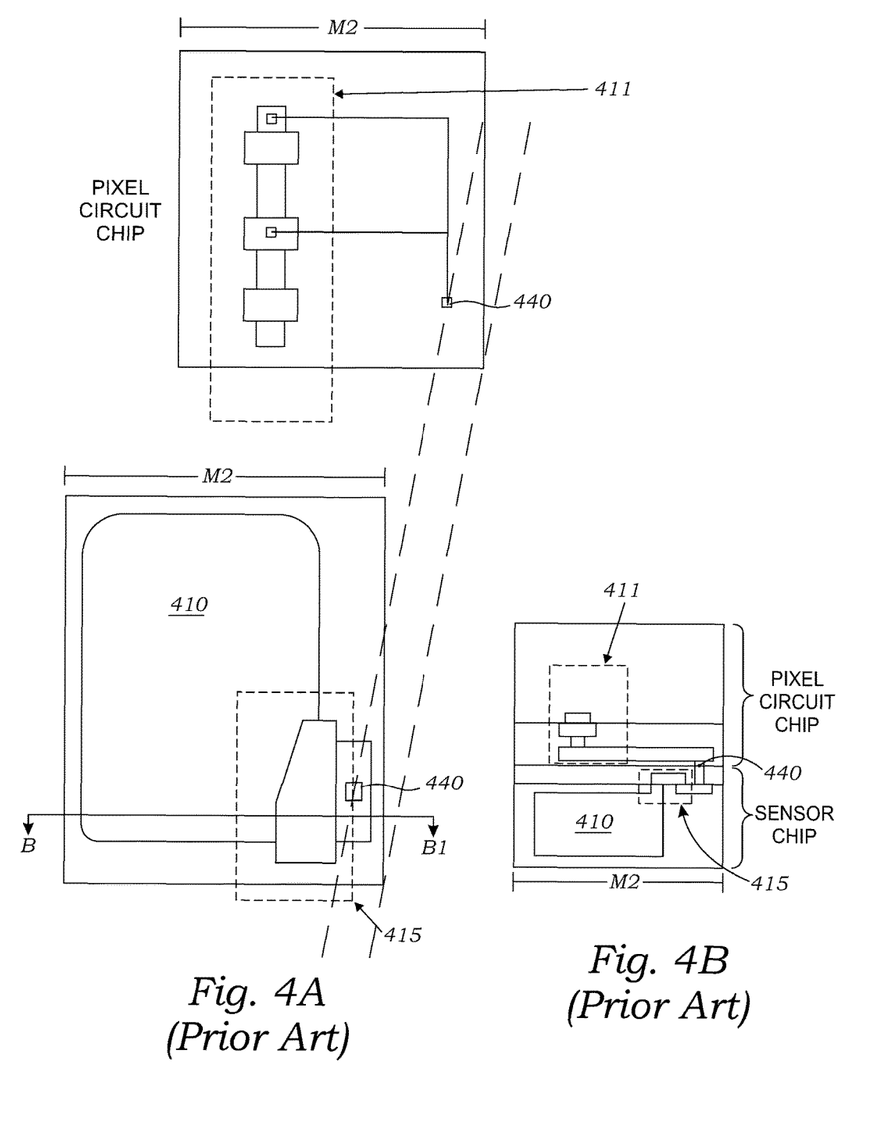
FIG. 4A is an exploded view diagram illustrating a common pixel cell layout in the prior art.
FIG. 4B is a cross section diagram of the pixel cell shown in FIG. 4A.

FIG. 4A is an exploded view diagram illustrating a common pixel cell layout in the prior art wherein photodiode 410 and planar CMOSFET transfer transistor 415 are located on the semiconductor substrate of a sensor wafer of chip and pixel circuitry 411 is located on a separate substrate of a circuit semiconductor wafer or chip. FIG. 4A shows an exploded view of a sensor chip and its components positioned on its upper surface aligned, to a circuit chip with its components positioned on its underside, at inter-chip interconnect 440. FIG. 4B is a cross section diagram of the pixel cell shown in FIG. 4A along its cross section line BB' including the overlying portion of the circuit chip. FIG. 4B illustrates the two stacked semiconductor chips are electrically coupled by inter-chip interconnect 440. Comparing FIG. 3A and FIG. 4A one skilled in the art will appreciate that, assuming photodiodes 310 and 410 have the same dimensions, die dimension M2 is smaller than dimension M1 thus providing an opportunity for manufacturing cost reduction.

Figures 5A, 5B:
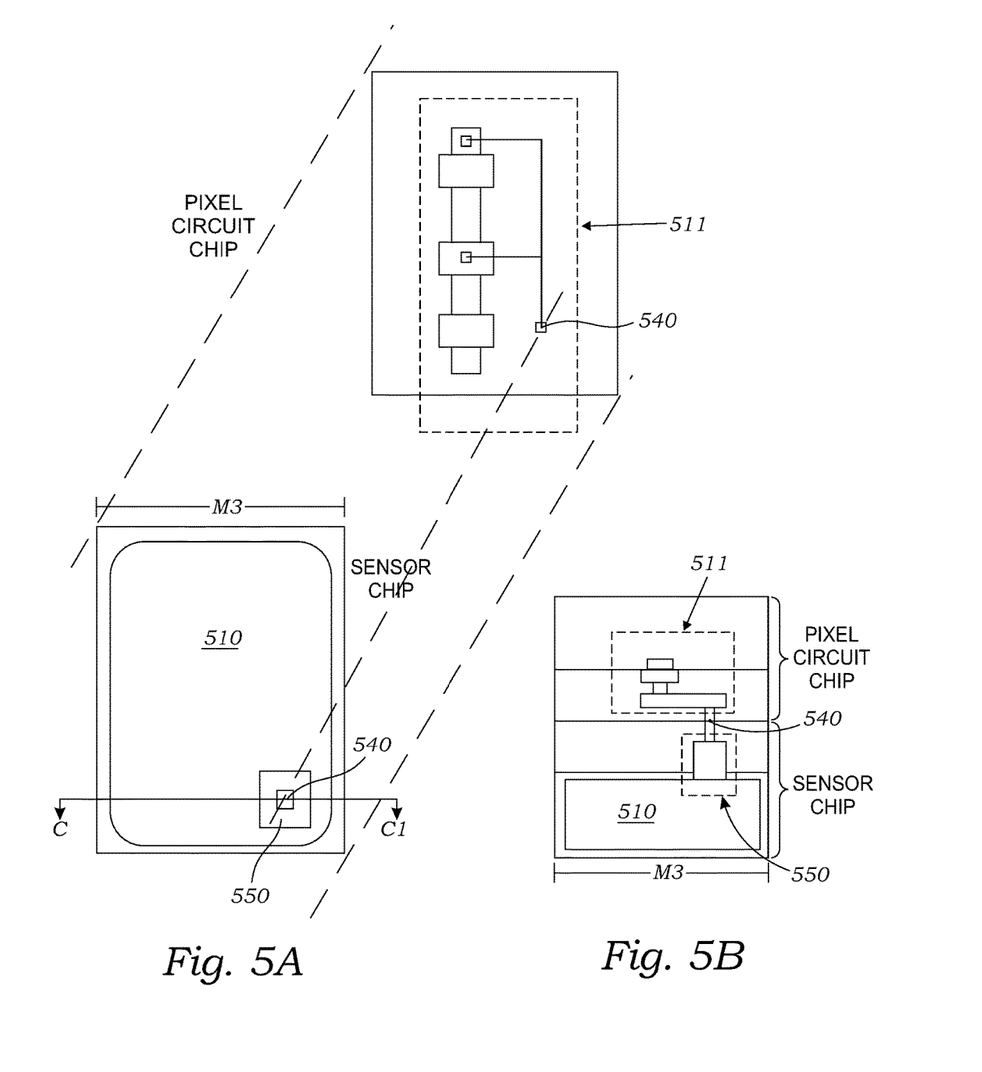
FIG. 5A is an exploded view diagram of a pixel cell in accordance with an embodiment of the invention.
FIG. 5B is a cross section diagram of the pixel cell shown in FIG. 5A.

In the stacked assembly illustrated in FIG. 4A and FIG. 4B the limiting die dimension is determined by the sensor chip. Assuming it is desired to retain the dimensions of the photodiode, one opportunity for further reduction to die dimension is to reduce the transfer transistor size or relocate it within the footprint of the photodiode. FIG. 5A is an exploded view diagram of a pixel cell in accordance with a first embodiment of the invention. FIG. 5A illustrates a pixel cell layout wherein photodiode 510 and vertical channel MOSFET transfer transistor 550 are located on the semiconductor substrate of a sensor wafer or chip and pixel circuitry 511 is located on a separate substrate of a circuit semiconductor wafer or chip. FIG. 5A shows an exploded view of a sensor chip and its components positioned on its upper surface aligned at inter-chip interconnect 540 to a circuit chip with its components positioned on its underside. FIG. 5B is a cross section diagram of the pixel cell shown in FIG. 5A along its cross section line CC' including the overlying portion of the circuit chip. FIG. 5B illustrates the two stacked semiconductor chips shown in FIG. 5A may be electrically coupled by inter-chip interconnect 540. Comparing FIG. 4A and FIG. 5A one skilled in the art will appreciate that, assuming photodiodes 410 and 510 have the same dimensions, die dimension M3 is smaller than dimension M2 thus providing an opportunity for manufacturing cost reduction.

Figure 6:
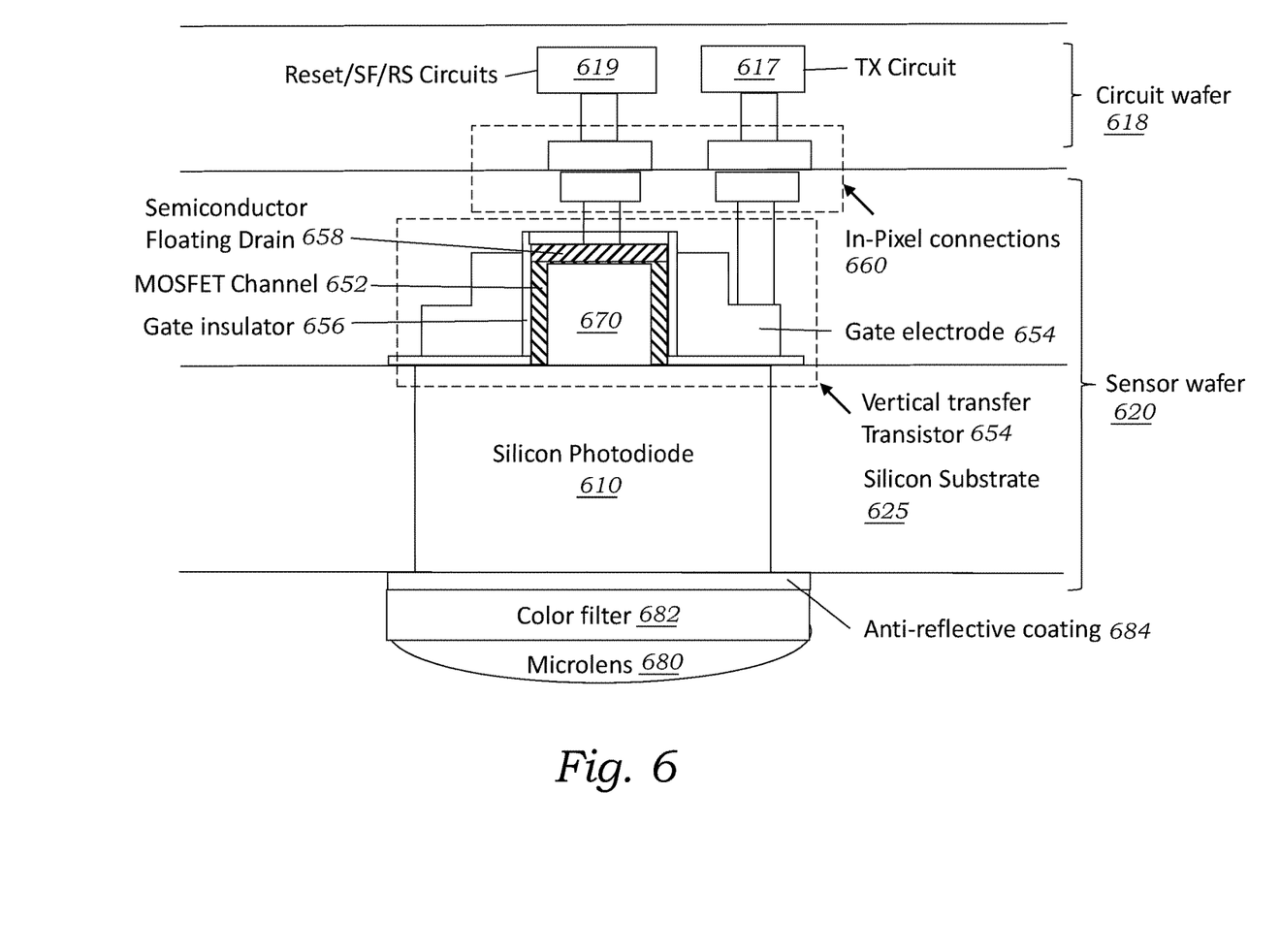
FIG. 6 is a cross section diagram of a pixel cell in accordance with an embodiment of the invention.

FIG. 6 is a cross section diagram of a pixel cell in accordance with a first embodiment of the invention. FIG. 6 illustrates in more detail the cross section of the generalized pixel cell illustrated in FIG. 5B and shows many of the enabling features of a vertical channel transfer transistor. FIG. 6 shows circuit wafer or chip 618 stacked on sensor wafer or chip 620 with in-pixel inter-chip interconnects 660 coupling them at their common interface. Circuit chip 618 includes a block diagram of the pixel readout circuits of FIG. 2, i.e., circuit block 619 includes a reset transistor, a source follower (SF) transistor, and a row select (RS) transistor. In addition, circuit chip 618 includes an additional circuit block 617 to provide a transfer signal TX to a transfer transistor.

Sensor chip 620 of FIG. 6 includes a detailed cross section diagram of vertical channel MOSFET transfer transistor 650 and its underlying photodiode 610 according to an embodiment of the invention. Photodiode 610 may be formed in P type silicon substrate 625 and may be comprised of N type silicon region 610 where photo-charge is generated in response to incident light during an exposure period and held for transfer to the readout circuits by vertical channel MOSFET transfer transistor 650. Vertical channel MOSFET transfer transistor 650 derives its function and descriptive name principally from the fact that its MOSFET channel region 652 is oriented with its axis perpendicular to the surface of the semiconductor substrate 625 as shown in FIG. 6. This perpendicular orientation of a MOSFET channel facilitates the positioning of a transfer transistor over a photodiode area which allows a sensor chip's dimensions to be limited mainly by the dimensions of the photodiode. Vertical channel MOSFET transfer transistor 650 is composed of source region 610, i.e. the photodiode region, channel region 652, insulated gate electrode 654, gate insulator 656, and drain region 658. In the embodiment illustrated by FIG. 6, source region 610 may N type silicon, channel region 652 may be P type silicon and drain region 658 may be N type silicon. Persons skilled in the art will recognize that another embodiment may be constructed with a N type silicon substrate, a P type silicon source/photodiode region, a N type channel region, and a P type silicon drain region. Persons skilled in the art will also recognize that the semiconductor materials employed may also include materials other than Silicon such as Germanium, Gallium Arsenide, Silicon Carbide, Graphene, and Boron Nitride and the like, and that the semiconductor materials employed may be crystalline, polycrystalline, or amorphous.

In the embodiment illustrated in FIG. 6, channel region 652 is formed on the vertical side of insulator support structure 670 which acts as a mandrel. The shape of insulator structure 670, may be one of a mesa in a plane which is both parallel to sensor wafer substrate 625 and out of the plane of FIG. 6 and may have the shape of a cylinder, rectangle, octagon or any polygon. The semiconductor material of channel region 652 may be deposited by known deposition techniques onto insulator structure 670 at a thickness small enough to facilitate the switching of electrical carriers within it by the application of a suitable bias voltage on insulated gate electrode 654. Typically such bias voltage is the previously described transfer signal TX. Gate electrode 654 is typically formed of a metal or doped semiconductor and it may be separated and insulated from channel region 652 by thin insulator 656. Gate electrode 654, thin insulator 656 and channel region 652 may be formed as concentric toroids in the instance wherein insulator structure 670 is shaped like a cylinder with axis perpendicular to the plane of sensor wafer substrate 625. The pixel cell embodiment illustrated in FIG.

6 may also include commonly known features such as microlens 680, color filter 682 and anti-reflective coating 684.

Figure 7:
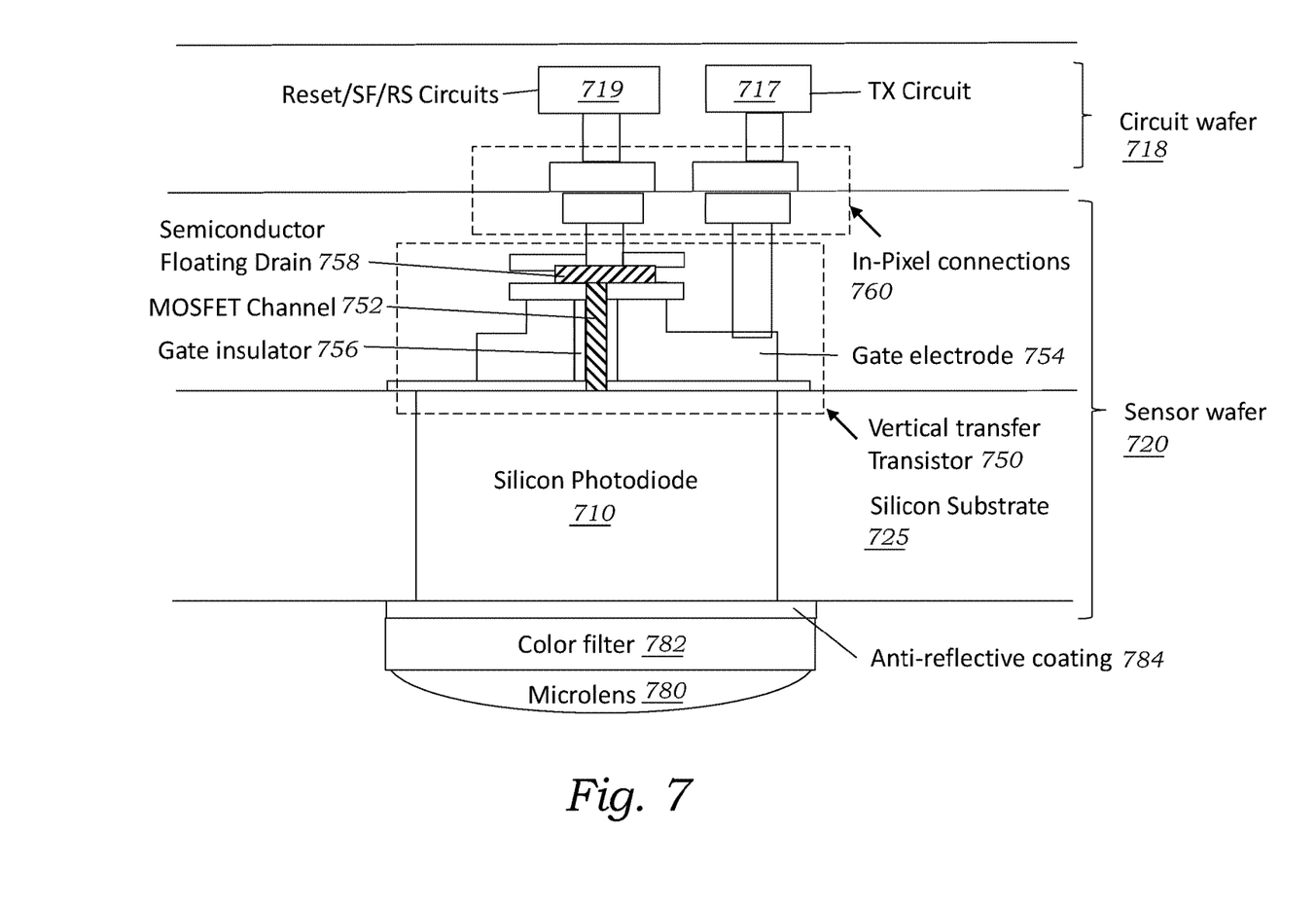
FIG. 7 is a cross section diagram of a pixel cell in accordance with an embodiment of the invention.

FIG. 7 is a cross section diagram of a pixel cell in accordance with a second embodiment of the invention wherein the pixel cell is similar in structure to the pixel cell illustrated by FIG. 6 but absent insulator support structure 670. With insulator support structure 670 of FIG. 6 absent, vertical channel region 780 illustrated in FIG. 7 takes the shape of a solid cylinder or post of semiconductor material with axis perpendicular to the plane of sensor wafer substrate 725. Persons skilled in the art will recognize that post shaped structure 780 may be formed by epitaxial growth of semiconductor material within a hole formed on semiconductor substrate 725 over photodiode 710. Gate electrode 754 and thin insulator 756 may be formed as concentric toroids in the embodiment illustrated by FIG. 7 wherein vertical channel region structure 780 is shaped like a solid cylinder or post with axis perpendicular to the plane of sensor wafer substrate 625.

Figures 8A, 8B:
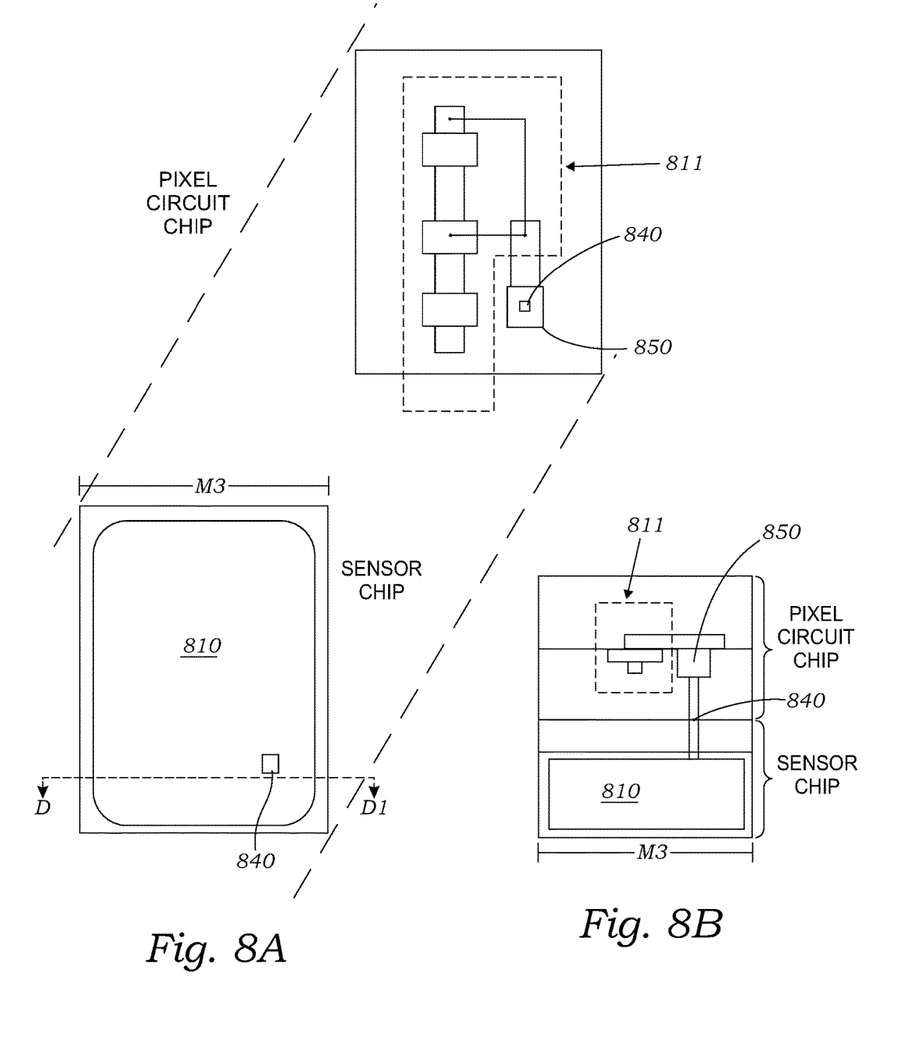
FIG. 8A is an exploded view diagram of a pixel cell in accordance with an embodiment of the invention.
FIG. 8B is a cross section diagram of the pixel cell shown in FIG. 7A.

FIG. 8A is an exploded view diagram of a pixel cell in accordance with a third embodiment of the invention. FIG. 8A illustrates a pixel cell layout wherein photodiode 810 is located on the semiconductor substrate of a sensor wafer or chip while pixel circuitry 811 and vertical channel MOSFET transfer transistor 850 are located on a separate substrate of a circuit wafer or chip. FIG. 8A shows an exploded view of a sensor chip and its components positioned on its upper surface aligned at inter-chip interconnect 840 to a circuit chip with its components positioned on its underside. FIG. 8B is a cross section diagram of the pixel cell shown in FIG. 8A along its cross section line DD' including the overlying portion of the circuit chip. FIG. 8B illustrates the two stacked semiconductor chips shown in FIG. 8A may be electrically coupled by inter-chip interconnect 840.

Figure 9:
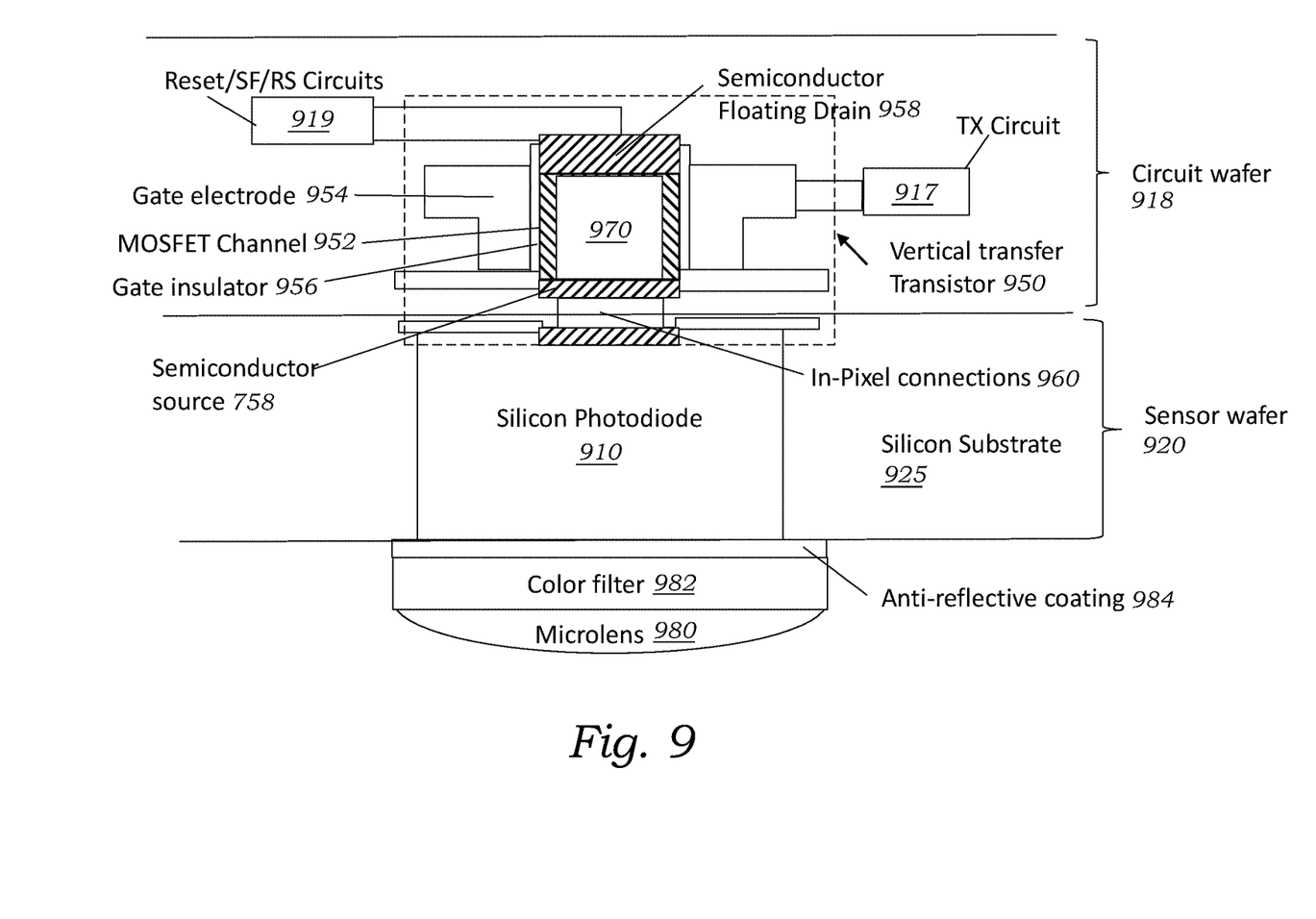
FIG. 9 is a cross section diagram of a pixel cell in accordance with an embodiment of the invention.

FIG. 9 is a cross section diagram of a pixel cell in accordance with a third embodiment of the invention. FIG. 9 illustrates in more detail the cross section of the generalized pixel cell illustrated in FIG. 8B and shows many of the enabling features of a vertical channel transfer transistor. FIG. 9 shows circuit wafer or chip 918 stacked on sensor wafer or chip 920 with in-pixel inter-chip interconnects 960 coupling them at their common interface. Circuit chip 918 includes a block diagram of the pixel readout circuits of FIG. 2, i.e., circuit block 919 includes a reset transistor, a source follower (SF) transistor, and a row select (RS) transistor. In addition, circuit chip 918 includes an additional circuit block 917 to provide a transfer signal TX to a transfer transistor and vertical channel MOSFET transfer transistor 950.

Sensor chip 920 of FIG. 9 includes a detailed cross section diagram of photodiode 910 according to a third embodiment of the invention. Photodiode 910 may be formed in P type silicon substrate 925 and may be comprised of N type silicon region 910 where photo-charge is generated in response to incident light during an exposure period and held for transfer to the readout circuits by vertical channel MOSFET transfer transistor 950. Vertical channel MOSFET transfer transistor 950 is composed of source region 910, i.e. the photodiode region, channel region 952, insulated gate electrode 954, gate insulator 956, and drain region 958. Forming the vertical channel MOSFET on the circuit wafer as illustrated in a third embodiment illustrated in FIG. 9 may offer fabrication advantages.

In this application, directional terminology such as "top", "down", "above", "below" are used with reference to the orientation of the figure(s) being described. Also, the terms "have," "include," "contain," and similar terms are defined to mean "comprising" unless specifically stated otherwise. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

The above description of illustrated examples of the present invention, including what is described in the Abstract, are not intended to be exhaustive or to be limited to the precise forms disclosed. While specific embodiments of, and examples for, the invention are described herein for illustrative purposes, various equivalent modifications are possible without departing from the broader spirit and scope of the present invention. Indeed, it is appreciated that the specific example structures and materials are provided for explanation purposes and that other structures and materials may also be employed in other embodiments and examples in accordance with the teachings of the present invention. These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A pixel cell, comprising:
   a photodiode disposed within a first substrate of a first semiconductor chip for accumulating an image charge in response to light incident upon the photodiode;
   a readout circuit disposed within a second substrate of a second semiconductor chip; and
   a vertical channel transfer transistor coupled between the photodiode and the readout circuitry to transfer the image charge from the photodiode to the readout circuitry, wherein the vertical channel transfer transistor is disposed within the first substrate of the first semiconductor chip, and wherein the vertical channel transfer transistor is a MOSFET transistor comprising:
   a source region coupled to the photodiode;
   a vertical semiconductor channel region coupled to the source region;
   a drain region coupled to semiconductor channel and the readout circuitry;
   an insulated gate electrode formed proximate the vertical semiconductor channel; and
   a polygonal mesa extending upwardly above a surface of the first semiconductor chip, wherein the vertical semiconductor channel region is formed on at least one the vertical walls of a polygonal mesa having an insulating material as the center of said polygonal mesa, wherein the plane of the walls is perpendicular to the plane of the first semiconductor chip.

2. The pixel cell of claim 1 wherein the vertical semiconductor channel region comprises a P type semiconductor and the source and drain regions comprise an N type semiconductor.

3. The pixel cell of claim 1 wherein the vertical semiconductor channel region comprises an N type semiconductor and the source and drain regions comprise a P type semiconductor.

4. The pixel cell of claim 1 wherein the insulated gate electrode comprises at least one of a metal and a doped semiconductor formed over an insulating layer, wherein the insulating layer is formed over the channel region.

5. The pixel cell of claim 1 wherein the readout circuit comprises a reset transistor, a source follower amplifier transistor, and a row select transistor.

* * * * *